United States Patent [19]

Kaihotsu et al.

[11] Patent Number: 5,669,644
[45] Date of Patent: Sep. 23, 1997

[54] WAFER TRANSFER PLATE

[75] Inventors: Hideki Kaihotsu; Kazuhiro Shimeno; Kouji Tometsuka, all of Tokyo, Japan

[73] Assignee: Kokusai Electric Co., Ltd., Japan

[21] Appl. No.: 557,409

[22] Filed: Nov. 13, 1995

[51] Int. Cl.⁶ ................................................ B25J 15/00
[52] U.S. Cl. ........................... 294/1.1; 294/902; 414/941
[58] Field of Search ............................. 294/1.1, 16, 27.1, 294/32, 34, 64.1, 64.3, 92, 902; 414/225, 737, 752, 935, 937, 939, 941; 901/31, 40; 29/740, 743

[56] References Cited

U.S. PATENT DOCUMENTS

| | | | |
|---|---|---|---|
| 3,539,216 | 11/1970 | Forcier | 294/64.3 |
| 4,410,209 | 10/1983 | Trapani | 294/34 |
| 4,639,028 | 1/1987 | Olson | 294/34 |
| 5,061,144 | 10/1991 | Akimoto et al. | 294/32 |
| 5,188,501 | 2/1993 | Tomita et al. | 414/941 |
| 5,280,979 | 1/1994 | Poli et al. | 294/64.1 |
| 5,406,695 | 4/1995 | Amemori | 29/603.25 |

FOREIGN PATENT DOCUMENTS

| | | | |
|---|---|---|---|
| 63-204738 | 8/1988 | Japan | 414/941 |
| 6-127621 | 5/1994 | Japan | 414/941 |

OTHER PUBLICATIONS

IBM Technical Disclosure Bulletin, vol. 19, No. 3 Aug. 1976.

*Primary Examiner*—Dean Kramer
*Attorney, Agent, or Firm*—Graham & James LLP

[57] ABSTRACT

A wafer transfer plate adapted to be disposed on a wafer transfer unit for transferring a wafer within a wafer manufacturing system, which comprises at least one wafer contact portion designed to be held in contact with the wafer as the wafer transfer plate is loaded with the wafer, a coated film being formed of a material which does not contain harmful elements and provided at a region including the wafer contact portion.

16 Claims, 5 Drawing Sheets

WAFER TRANSFER PLATE

TECHNICAL BACKGROUND

The present invention relates to a wafer transfer plate for receiving a wafer during its transfer within a semiconductor manufacturing system.

Referring to FIG. 8, a semiconductor manufacturing system will be explained briefly hereinafter. Designated by reference numeral 9 in the figure is a wafer transfer unit, details of which are shown in FIG. 9.

A reaction furnace 1 is disposed on an upper part of the semiconductor manufacturing system. A reaction tube 2 is accommodated within the reaction furnace 1. At a lower part of the reaction furnace 1, there is provided a boat elevator 3, which is designed to introduce a boat 5 with a wafer 4 loaded thereon into the reaction tube 2 and to pull it out therefrom.

The wafer 4 is transferred in a wafer cassette 6 between the semiconductor manufacturing system and outside thereof. The wafer cassette 6 is relayed at a wafer cassette delivery station (not shown) and then received by a buffer cassette stocker 7 and then a cassette stocker 8. Thereafter, the wafer 4 in the wafer cassette 6 accommodated within the cassette stocker 8 is transferred onto the descending boat 5 by means of the wafer transfer unit 9.

As explained above, the boat elevator 3 introduces the boat 5 into the reaction tube 2 and takes the boat 5 out of the reaction tube 2 as filming on the wafer 4 is completed.

Following the foregoing steps backward, the processed wafer is transferred from the boat 5 to the wafer cassette 6 of the cassette stocker 8 and then to outside of the semiconductor manufacturing system.

In the figure, reference numerals 10 and 11 denote air clean units.

As is now apparent, transfer of the wafer 4 is done automatically between the boat 5 and cassette stocker 8 by means of the wafer transfer unit 9.

The wafer transfer unit 9 has a chucking head 12 linear movably, elevatably and rotatably supported thereon. The chucking head 12 has a plurality of wafer transfer plates 13. First, the wafer transfer plates 13 are positioned below the wafer 4 to carry the latter thereon. The wafer transfer plates 13 are inserted into a wafer retainer such as the boat or wafer cassette are slightly elevated to receive the wafers and the wafer transfer plate 13 are inserted another wafer retainer. The wafer transfer plates 13 are slightly lowered so as to effect the transfer of the wafer onto the wafer retainer.

Reference is now made to FIG. 10 and FIG. 11 in which a sample form of the wafer transfer cassette is illustrated.

The wafer transfer plate 13 is comprised of a grip portion 13a to be gripped by the chucking head 12 and a wafer receiving portion 13b. The wafer receiving portion 13b is provided with an arc-shaped, stepped or recessed portion 17 having a diameter substantially equal to the outer configuration of the wafer 4 and a predetermined width. The stepped portion 17 is raised with respect to a central portion of the wafer receiving portion 13b more than the amount of warp or bend of the wafer 4. As it is transferred, the wafer 4 is retained at its peripheral edge by the stepped portion 17.

In use, the wafer transfer plate 13 supports the wafer by its width in contact with an area of the wafer 4 spanning several millimeters from a peripheral edge thereof. Stated otherwise, the wafer is in surface-to-surface contact with the wafer transfer plate at the area of several millimeters from its peripheral edge. Thus, it is likely that particles are adhered to the wafer transfer plate. Consequently, there has been a problem that particles may adhere to the wafer during its transfer.

Apart from the above, it is required of the wafer transfer plate to be thin with respect to the direction of load so that it may be inserted into a narrow gap between adjacent two wafers to be retained. For this reason, the plate is normally made of a material of high strength, such as ceramics and stainless steel. As it may easily be appreciated, ceramics and metallic elements contain impurities such as heavy metals, sodium (Na) and calcium (Ca) which are harmful elements. If heavy metals, sodium and calcium adhere to and infiltrate into the wafer, quality and efficiency of the wafer as a semiconductor deteriorates significantly. And the wafer transfer plate is so far made of quartz of harmless to wafers. Quartz, however, has low strength and easily warp and wafers recently tend to be upsized and to increase in mass. For this reason, the wafer transfer plate of quartz is not available to be inserted into a narrow gap.

SUMMARY OF THE INVENTION

It is therefore an object of the present invention to achieve precision-enhanced processing of a wafer and hence to enable precision-enhanced semiconductor manufacturing to thereby prevent deterioration of the quality and efficiency of the wafer as a semiconductor. This object is met by a wafer transfer plate for receiving a wafer according to the present invention, which is adapted to be disposed on a wafer transfer unit for transferring the wafer, the wafer transfer plate having a wafer contact portion which contacts the wafer as the latter is received. The wafer transfer plate may be provided with a coat of film, being formed from a material which does not contain harmful elements, at an area including the wafer contact portion.

The coat may be formed of a hard carbon film, a ceramic thin film, a silicon carbide film, or a fluororesin film. The coated film may be formed of a hard carbon or DLC.

Coating is formed at that portion of the wafer transfer plate that will be held in contact with the wafer.

DETAILED DESCRIPTION OF THE PREFERRED EMBODIMENTS

Figure 1:
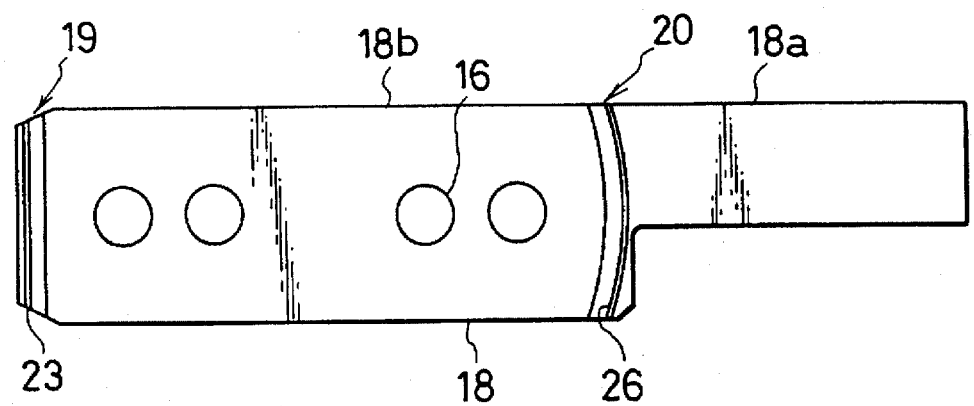
FIG. 1 is a top plan view of a wafer transfer plate employing the present invention.

Preferred embodiments of the present invention will now be described, by way of example only, with reference to the accompanying drawings. In FIGS. 1–7, same reference numerals will be used for corresponding parts in FIGS. 8–11 and their description will be omitted.

Referring to FIG. 1, a wafer transfer plate 18 is provided with a coating of a predetermined depth in a predetermined area thereof, or at least on a portion to be held in contact with a wafer, which does not contain sodium (Na) and calcium (Ca) that bring about harmful effects during the manufacture of semiconductors, and is a hard, highly pure, chemically-stable coating such as a hard carbon film coating, a ceramic thin film coating, a silicon carbide film coating and a fluororesin coating.

The wafer transfer plate 18 is comprised of a grip portion 18a to be gripped by a chucking head 12 (FIG. 9) and a wafer receiving portion 18b. On opposite ends of the surface of the wafer receiving portion 18b, there are provided receptor portions 19, 20, the receptor portion 19 being linearly formed and the receptor portion 20 being in the form of an arc matching with the outer diameter of the wafer 4. The receptor portions 19, 20 have respective inclined surfaces 21, 22 and 24, 25 which are inclined at different angles. These inclined surfaces or slopes are formed to have steep grades increasing outside from a central part of the wafer receiving portion 18b. The slopes 21 and 22 jointly define a border line 23 therebetween. Similarly, the slopes 24 and 25 jointly define a border line 26 therebetween. The distance between the receptor portion 19 and receptor portion 20 is determined such that when the wafer 4 is fitted into the receptor portions 19, 20, the border line 23 comes into an orientation flat of the wafer 4 and the border line 26 comes into an arc of the wafer 4 opposite from the orientation flat.

In the present embodiment, at least the inclined surfaces 21, 22, 24 and 25, forming the receptor portions 19, 20, are coated.

At predetermined portions of the wafer receiving portion 18b, there are provided ventholes 16 for facilitating flow of air to thereby achieve assured wafer transfer to and wafer removal from the wafer transfer plate 18.

Referring to FIG. 2, explanation will now be given as to how the wafer 4 is transferred onto the wafer transfer plate 18. In FIG. 2, the wafer 4 is shown to be displaced leftwardly with respect to the wafer transfer plate 18.

Figure 2A:
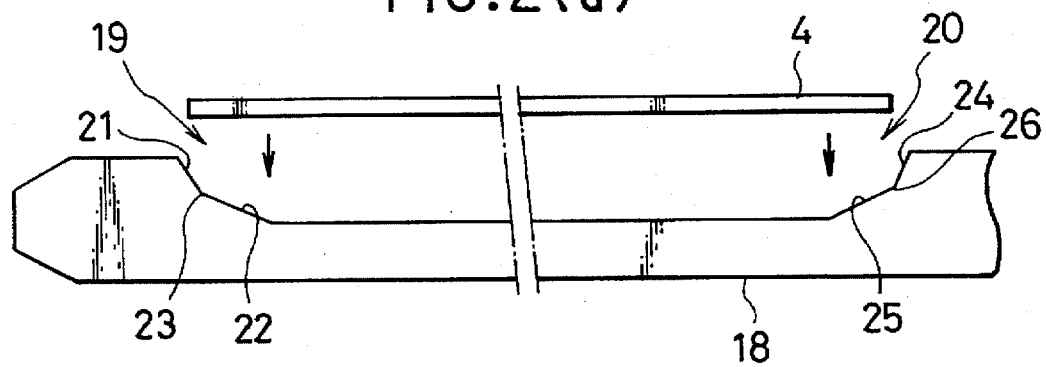
FIG. 2(a), FIG. 2(b) and FIG. 2(c) are explanatory views of the embodiment.

As shown in FIG. 2(a), the wafer transfer plate 18 is disposed below the wafer 4. As the wafer transfer plate 18 is elevated, the inclined surface 21 contacts a lower edge of the orientation flat of the wafer 4. When the wafer transfer plate 18 is further elevated, the wafer 4 moves rightward with its orientation flat sliding down along the inclined surface 21. During this operation, if the position in rotational direction of the wafer 4 is not in strict conformity with the wafer transfer plate 18, there occurs a non-parallel condition between the inclined surface 21 and orientation flat. Such non-parallel condition may be corrected by the wafer slide along the inclined surface 21.

When the lower edge of the orientation flat of the wafer 4 is in contact with the border line 23, the peripheral edge of the wafer 4 is also in contact with the opposed border line 26, resulting in the wafer 4 being immovably and stably held in position. The orientation flat is held in line-to-line contact with the border line 23 whilst the peripheral edge of the wafer 4 is held in arc-to-arc contact with the border line 26. As a result, rotational movement of the wafer 4 is also restricted. Rightward displacement of the wafer 4 may also be corrected in a similar manner.

Figure 2B:
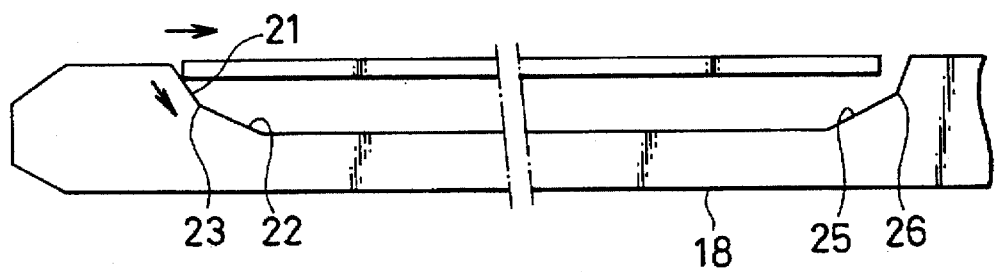
Figure 2C:
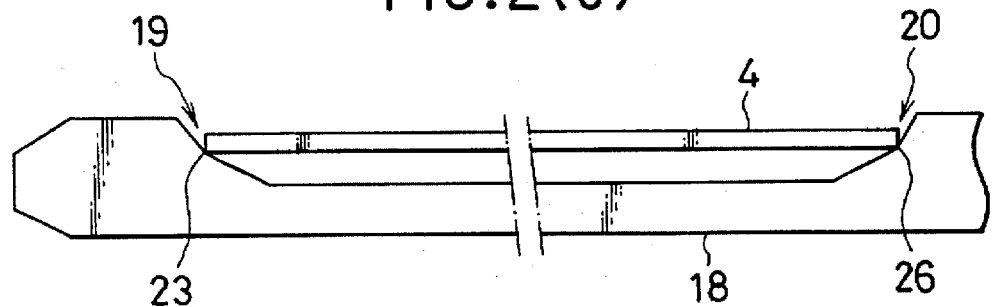

With the arrangements thus made, the wafer 4 may be held in position as long as it is located between the receptor portions 19 and 20 of the wafer transfer plate 18, because the position and orientation of the wafer 4 can be corrected (see FIG. 2(b) and FIG. 2(c)).

As is apparent from the above embodiment, only the receptor portions 19, 20 of the wafer transfer plate 18 are likely to contact the wafer 4, the wafer 4 may be prevented from being contaminated, because the receptor portions 19, 20 are covered by an unharmful coating.

As mentioned above, since it contacts only at its lower peripheral edge with the receptor portions 19, 20, the wafer 4 is supported by line contact with the wafer transfer plate 18, thus causing the area of contact of the wafer 4 with the wafer transfer plate 18 and hence the possibility of contamination of the wafer 4 to be significantly reduced. Since the area of contact of the wafer with the wafer transfer plate is decreased significantly, possibility of particle adherence to the wafer may be reduced.

Figure 3:
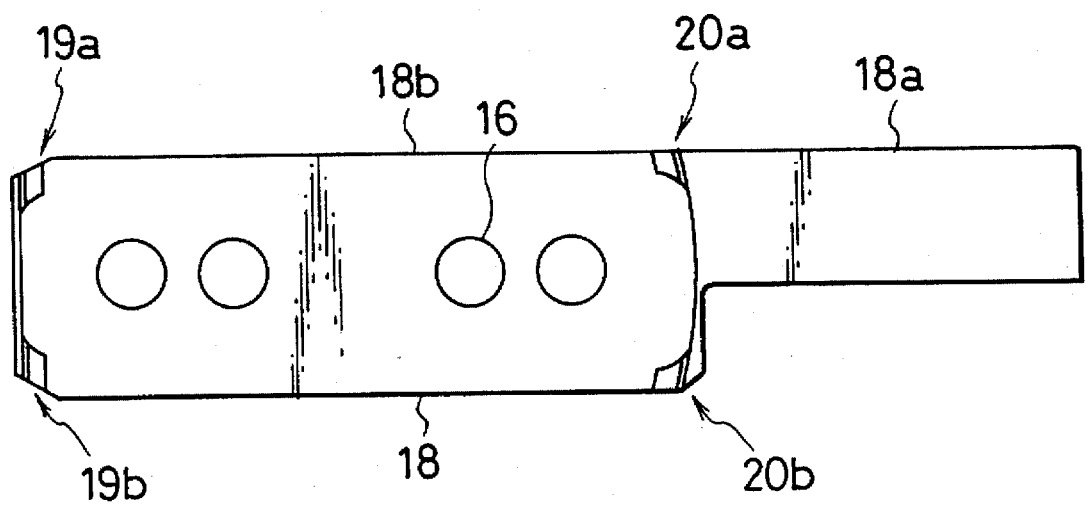
FIG. 3 is a top plan view of a separate wafer transfer plate employing the present invention.

The receptor portions 19, 20 as explained in connection with the above embodiment may be altered to fit to a desired application. For example, as shown in FIG. 3, the central portion of the edge of the plate may be cut off to provide four receptor portions 19a, 19b, 20a, 20b at both ends thereof. With this arrangement, the wafer 4 can be supported by the four receptor portions 19a, 19b, 20a, 20b of narrow width, resulting in the shortened length of the line contact of the wafer with the wafer transfer plate 18 and hence the further reduced area of contact of the wafer 4 with the wafer transfer plate 18.

Figure 4:
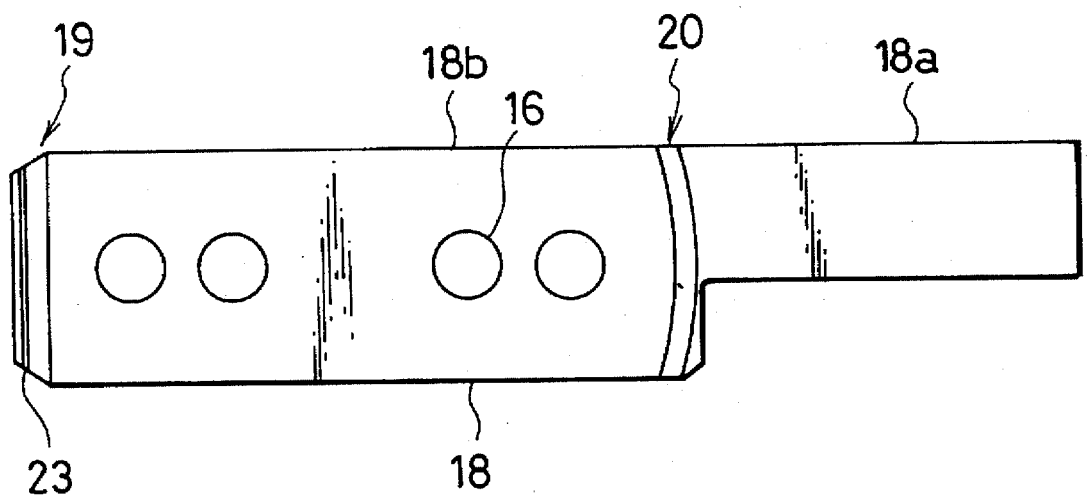
FIG. 4 is a top plan view illustrating an application of the embodiment.
Figure 5:
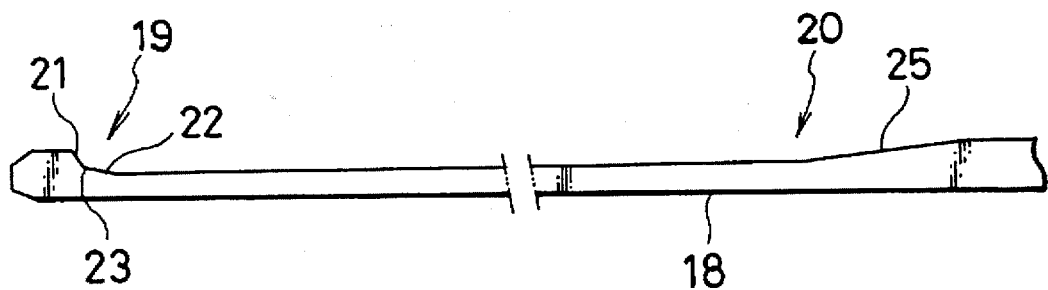
FIG. 5 is a partial side view of the embodiment of FIG. 4.

As shown in FIG. 4 and FIG. 5, the steep surface of one of the receptor portions 19, 20 may be omitted to form the one receptor portion by the gentle surface only (FIGS. 4 and 5 show a case where the steep surface 24 of the receptor portion 20 omitted.). The inclined surfaces 22 and 25 may suffice for the intended purpose if they are inclined slightly.

Figure 6:
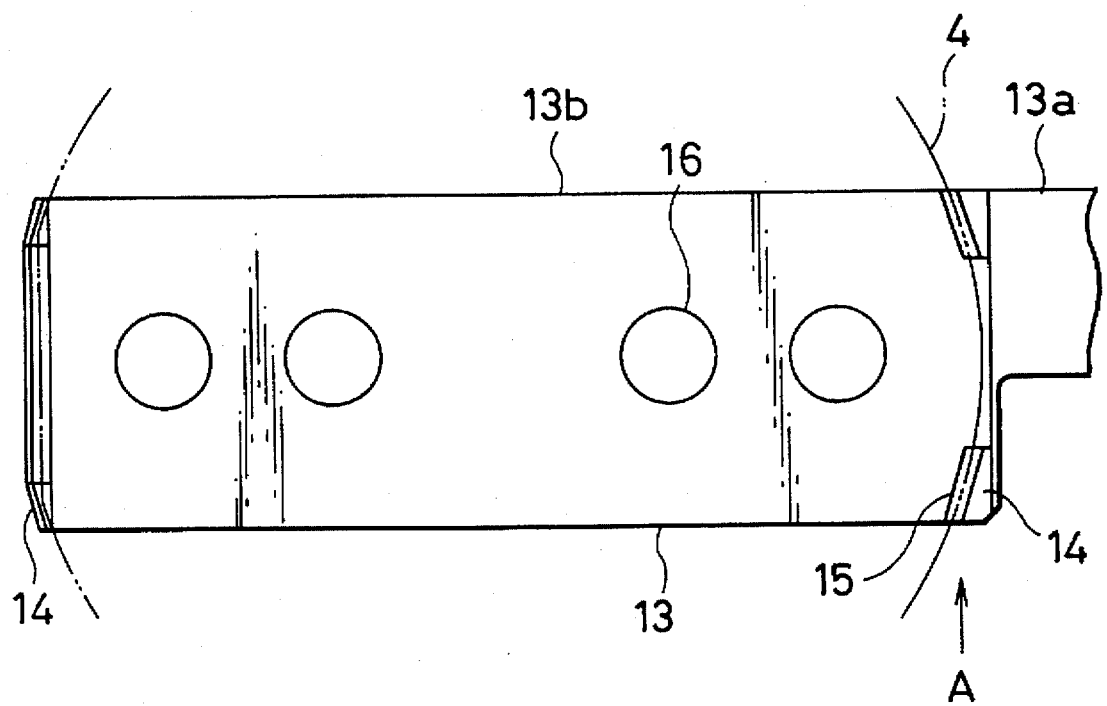
FIG. 6 is a top plan view of a further separate wafer transfer plate employing the present invention.
Figure 7:
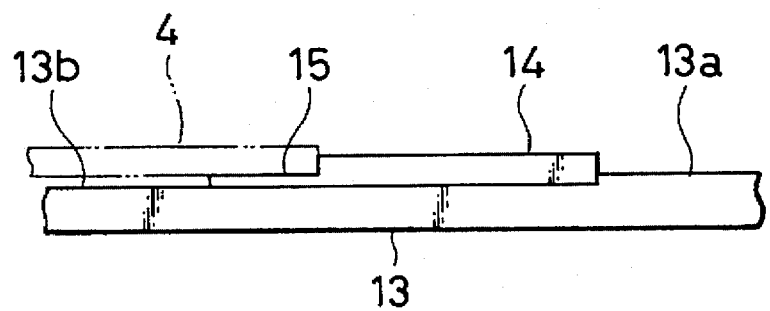
FIG. 7 is an enlarged view of the embodiment of FIG. 6 as seen from arrow A.
Figure 8:
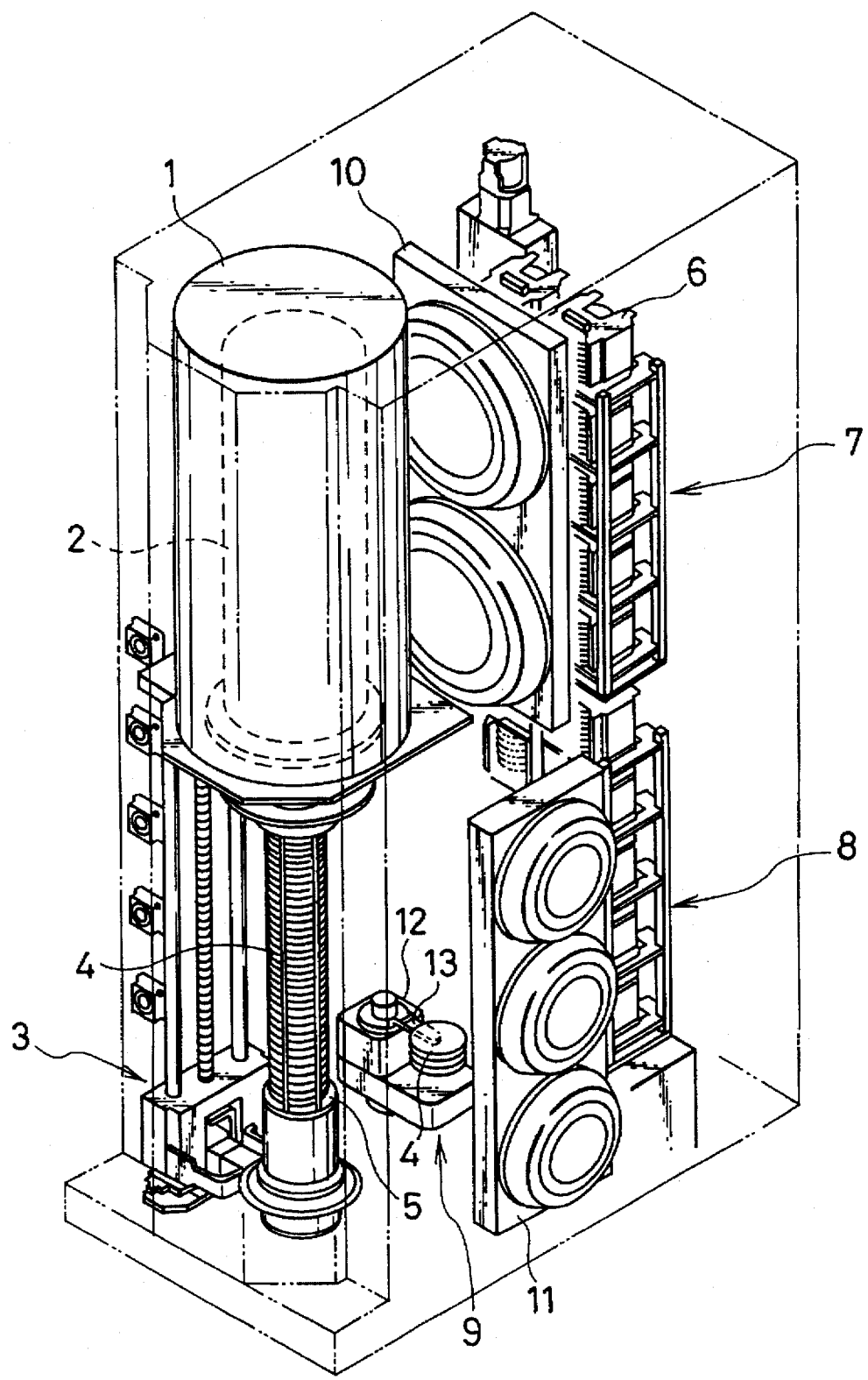
FIG. 8 is a schematic perspective of view of a semiconductor manufacturing system.
Figure 9:
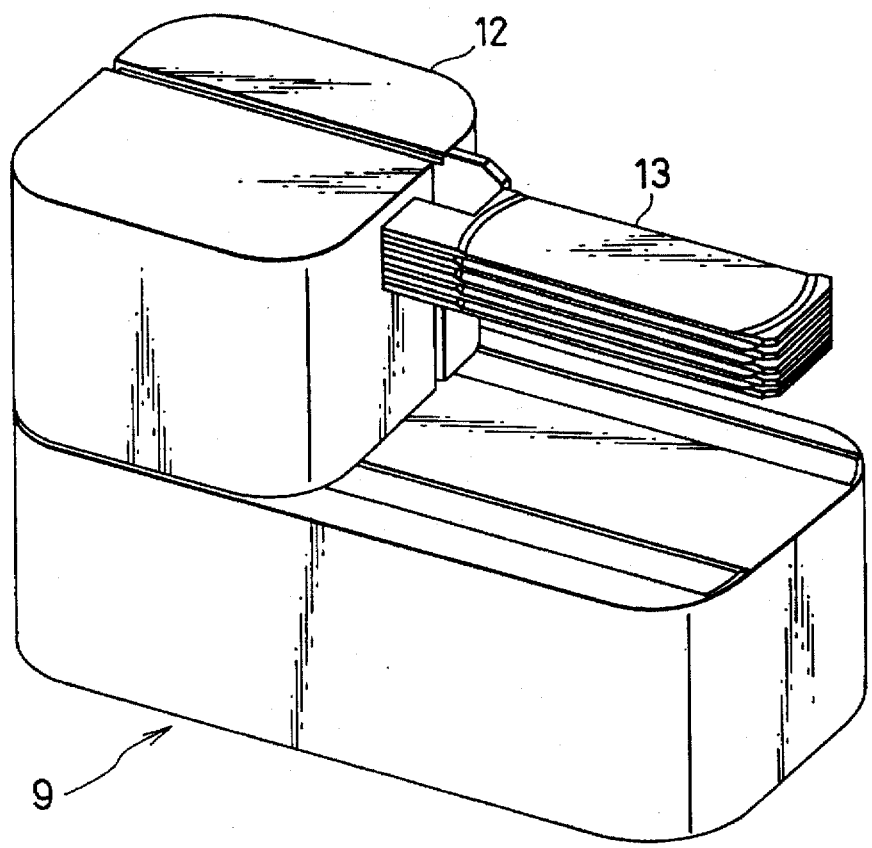
FIG. 9 illustrates a prior art device.
Figure 10:
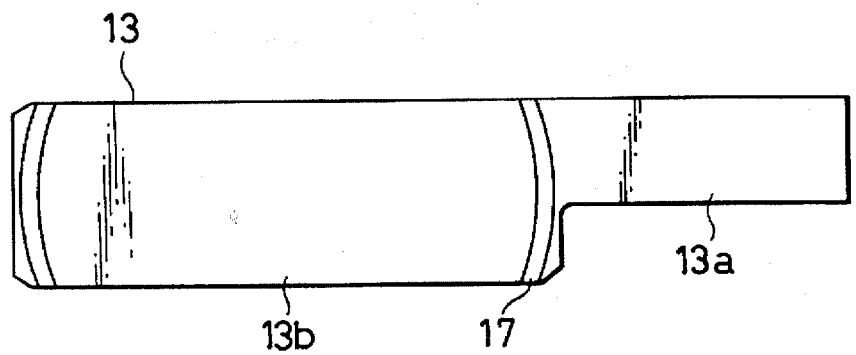
FIG. 10 is a top plan view of the known device.
Figure 11:
FIG. 11 is a side view of the device of FIG. 10.

Next, a separate wafer transfer plate employing the present invention will be explained with reference to FIG. 6 and FIG. 7.

The wafer transfer plate 13 is comprised of a grip portion 13a to be gripped by the chucking head 12 and a wafer receiving portion 13b. At four corners of the wafer receiving portion 13b, there is provided projections 14 having stepped portions 15. Each stepped portion 15 has a height larger than the central portion of the wafer receiving portion 13b by more than the bend of the wafer 4. The stepped portions 15 abut against the wafer 4 at four points. At predetermined positions of the wafer receiving portion 13b, there are provided a plurality of ventholes 16 which is adapted to facilitate flow of air to thereby achieve assured loading and removal of the wafer with respect thereto.

As the wafer 4 is retained by the wafer transfer plate 13, the wafer 4 is supported by the stepped portions 15 of the projections 14. Thus, coating may be given at least to the four projections 14 and stepped portions 15.

Explanation will now be made as to the above-mentioned hard, highly pure, chemically stable coating.

Named as examples of the hard carbon film are DLC (diamond like carbon), which exhibits hardness and electrical characteristics similar to those of diamond and is of amorphous structure crystallographically, amorphous transparent hard carbon (i-C) film, etc. The hardness of these films are 2,000–4,000 kg/mm$^2$ and are thus extremely high as compared to the hardness of the wafer; the hardness of diamond:the hardness of the wafer=10:8–9. Such films may be formed on the wafer transfer plate by vacuum vapor deposition, etc. Since hard coatings are thus obtained, particle generation due to wear of the coatings may be suppressed, and the wafer environment may be kept clean. As examples of the ceramic thin film free of harmful elements, SiC, $Si_3N_4$, $SiO_2$ may be named. These may be filmed by CVD (chemical vapor deposition) and the like. The resulting coatings are of high purity, have thickness of more than several μm and do not contain impurities as harmful elements. Fluororesin coating may be achieved easily and is effective in preventing impurities such as sodium and calcium from adhering to and infiltrating into the wafer.

In the embodiments described above, the wafer transfer plate 13, 18 is provided with the coating at its wafer contact portion. Alternatively, the entire surface of the wafer transfer plate 13, 18 may be coated, or only the wafer receiving portion 13b, 18b may be coated, omitting the grip portion 13a, 18a. By changing in this manner the area and thickness of the coatings in compliance with desired applications, coating time and effort may be saved.

As thus far explained, according to the present invention, since the wafer transfer plate is coated with a film of hard, high purity and chemically stable substance, impurities contained in metals do not adhere to and infiltrate into wafers, whereby wafers of high quality and efficiency may be obtained.

What is claimed is:

1. A wafer transfer plate for use in a wafer manufacturing system, said wafer transfer plate comprising:
   at least one wafer contact for supporting a wafer loaded onto said wafer transfer plate by contacting said wafer; and
   a hard carbon film covering at least a portion of said at least one wafer contact, wherein said hard carbon film comprises material selected from a group consisting of diamond like carbon and a transparent hard carbon.

2. A wafer transfer plate according to claim 1 further comprising a plurality of said wafer contacts.

3. A wafer transfer plate according to claim 1 further comprising vent holes.

4. A wafer transfer plate for use in a wafer manufacturing system, said wafer transfer plate comprising:
   a grip portion adapted to be gripped by a moving mechanism; and
   a wafer receiving portion comprising:
     a member having an inner end connected to said grip portion and an outer end,
     a generally planar upper surface disposed between said inner end and said outer end,
     a plurality of receptors raised with respect to said upper surface and adapted to contact a wafer and support said wafer spaced above said upper surface, and
     a coating covering at least those portions of said plurality of receptors that contact said wafer, said coating comprising a material that does not contain elements harmful to said wafer, wherein said coating comprises a hard carbon film comprising a material selected from a group consisting of diamond like carbon and a transparent hard carbon.

5. A wafer transfer plate according to claim 4, wherein each of said plurality of receptors comprises at least one surface angled with respect to said upper surface.

6. A wafer transfer plate according to claim 4, wherein at least one of said plurality of receptors comprises at least a first surface angled at a first angle with respect to said upper surface and a second surface angled at a second angle with respect to said upper surface.

7. A wafer transfer plate according to claim 4, wherein said upper surface includes vent holes.

8. A wafer transfer plate according to claim 4, wherein said harmful elements comprise heavy metals.

9. A wafer transfer plate according to claim 4, wherein said harmful elements comprise sodium and calcium.

10. A wafer transfer unit for use in a wafer manufacturing system, said wafer transfer unit comprising:
    a plurality of wafer transfer plates each having a first end and a second end; and
    a chucking head for supporting each of said plurality of wafer transfer plates at said first end such that said plurality of wafer transfer plates are disposed in a stacked relationship with one another with a vertical space between each of said wafer transfer plates, wherein each said wafer transfer plates comprises:
      a generally planar upper surface disposed between said first end and said second end,
      a plurality of receptors raised with respect to said upper surface and adapted to contact a wafer and support said wafer spaced above said upper surface, and
      a coating covering at least those portions of said plurality of receptors that contact said wafer, said coating comprising a material that does not contain elements harmful to said wafer, wherein said coating comprises a hard carbon film comprising a material selected from a group consisting of diamond like carbon and a transparent hard carbon.

11. A wafer transfer unit according to claim 10, wherein each of said plurality of receptors comprises at least one surface angled with respect to said upper surface.

12. A wafer transfer unit according to claim 10, wherein at least one of said plurality of receptors comprises at least a first surface angled at a first angle with respect to said upper surface and a second surface angled at a second angle with respect to said upper surface.

13. A wafer transfer unit according to claim 10, wherein said upper surface includes vent holes.

14. The wafer transfer unit of claim 10, wherein each of said plurality of wafer transfer plates comprises a high strength material selected from a group of materials consisting of ceramic and steel.

15. A wafer transfer unit according to claim 10, wherein said harmful elements comprise heavy metals.

16. A wafer transfer unit according to claim 10, wherein said harmful elements comprise sodium and calcium.

* * * * *